(12) United States Patent
Dinger et al.

(10) Patent No.: US 8,710,471 B2
(45) Date of Patent: Apr. 29, 2014

(54) PROJECTION ILLUMINATION SYSTEM FOR EUV MICROLITHOGRAPHY

(75) Inventors: Udo Dinger, Oberkochen (DE); Markus Hauf, Ulm (DE)

(73) Assignee: Carl Zeiss SMT GmbH, Oberkochen (DE)

(*) Notice: Subject to any disclaimer, the term of this patent is extended or adjusted under 35 U.S.C. 154(b) by 72 days.

(21) Appl. No.: 12/887,139

(22) Filed: Sep. 21, 2010

(65) Prior Publication Data

US 2011/0014799 A1 Jan. 20, 2011

Related U.S. Application Data

(63) Continuation of application No. PCT/EP2008/067594, filed on Dec. 16, 2008.

(30) Foreign Application Priority Data

Apr. 3, 2008 (DE) .................. 10 2008 000 967

(51) Int. Cl.
*H01L 21/26* (2006.01)
*H05G 2/00* (2006.01)

(52) U.S. Cl.
USPC ............... 250/504 R; 359/201.2; 359/196.1; 359/201.1; 359/202.1

(58) Field of Classification Search
USPC ............ 250/504 R, 503.1; 438/795; 359/350, 359/351, 850, 857, 196.1, 201.1, 202.1, 359/201.2; 378/34, 146
See application file for complete search history.

(56) References Cited

U.S. PATENT DOCUMENTS

| 3,077,958 | A | 2/1963 | Grimsey |
| 3,802,781 | A | 4/1974 | Wright |
| 3,837,125 | A | 9/1974 | Johnson |
| 3,879,105 | A | 4/1975 | Broche et al. |
| 3,917,385 | A | 11/1975 | Caswell |
| 4,028,547 | A | 6/1977 | Eisenberger |
| 4,038,971 | A | 8/1977 | Bezborodko |
| 4,060,315 | A | 11/1977 | Heinz |
| 4,092,518 | A | 5/1978 | Merard |

(Continued)

FOREIGN PATENT DOCUMENTS

| DE | 199 03 807 | 11/1999 |
| DE | 100 15 953 | 10/2000 |

(Continued)

OTHER PUBLICATIONS

International Search Report for corresponding PCT Application No. PCT/EP2008/067594.
English translation of German examination report corresponding to DE Application DE 10 2008 000 967.9, mailed Nov. 12, 2008.
International Search Report and a Written Opinion from the counterpart PCT Application No. PCT/EP2008/067594, dated May 6, 2009.
Ackermann, "Operation of a free-electron laser from the extreme ultraviolet to the water window, nature photonics", vol. 1 Jun. 2007 www.nature.com/naturephotonics.

(Continued)

*Primary Examiner* — Nicole Ippolito
*Assistant Examiner* — Wyatt Stoffa
(74) *Attorney, Agent, or Firm* — Fish & Richardson P.C.

(57) ABSTRACT

A projection illumination installation for EUV microlithography includes an EUV synchrotron light source for producing EUV used light. An object field is illuminated with the used light using illumination optics. The object field is mapped into an image field using projection optics. A scanning device is used to illuminate the object field by deflecting the used light in sync with a projection illumination period. The result is a projection illumination installation in which the output power from an EUV synchrotron light source can be used as efficiently as possible for EUV projection illumination.

28 Claims, 4 Drawing Sheets

(56) References Cited

U.S. PATENT DOCUMENTS

| | | |
|---|---|---|
| 4,162,120 A | 7/1979 | Moreno |
| 4,195,913 A | 4/1980 | Dourte et al. |
| 4,202,605 A | 5/1980 | Heinz |
| 4,226,507 A | 10/1980 | Fuschetto |
| 4,236,296 A | 12/1980 | Woolhouse et al. |
| 4,277,141 A | 7/1981 | Kleiber |
| 4,295,710 A | 10/1981 | Heinz |
| 4,348,090 A | 9/1982 | Iizuka |
| 4,380,391 A | 4/1983 | Buser et al. |
| 4,389,115 A | 6/1983 | Richter |
| 4,403,421 A | 9/1983 | Shepherd |
| 4,408,874 A | 10/1983 | Zinky et al. |
| 4,659,225 A | 4/1987 | Takahashi |
| 4,672,439 A | 6/1987 | Florence et al. |
| 4,674,874 A | 6/1987 | Halldorsson et al. |
| 4,705,369 A | 11/1987 | Humpal |
| 4,710,276 A | 12/1987 | Kull |
| 4,722,592 A | 2/1988 | Stolfi |
| 4,740,276 A | 4/1988 | Marmo et al. |
| 4,748,646 A | 5/1988 | Osada et al. |
| 4,803,713 A | 2/1989 | Fujii |
| 4,826,304 A | 5/1989 | Guch et al. |
| 4,849,668 A | 7/1989 | Crawley et al. |
| 4,865,454 A | 9/1989 | Lazzarini et al. |
| 4,871,237 A | 10/1989 | Anzai et al. |
| 4,932,770 A | 6/1990 | Caravaty |
| 4,932,778 A | 6/1990 | Parra |
| 4,953,965 A | 9/1990 | Iwase et al. |
| 4,959,531 A | 9/1990 | Marino |
| 4,967,088 A | 10/1990 | Stengl et al. |
| 4,969,726 A | 11/1990 | Koning |
| 5,025,284 A | 6/1991 | Komoriya et al. |
| 5,026,977 A | 6/1991 | Hubbard, Jr. |
| 5,074,654 A | 12/1991 | Alden et al. |
| 5,079,414 A | 1/1992 | Martin |
| 5,132,979 A | 7/1992 | Erbert |
| 5,157,555 A | 10/1992 | Reno |
| 5,204,712 A | 4/1993 | Bouwer et al. |
| 5,210,650 A | 5/1993 | O'Brien et al. |
| 5,339,346 A | 8/1994 | White |
| 5,339,720 A | 8/1994 | Pellarin et al. |
| 5,361,292 A | 11/1994 | Sweatt |
| 5,400,184 A | 3/1995 | Kuklo |
| 5,414,557 A | 5/1995 | Phillips |
| 5,428,482 A | 6/1995 | Bruning et al. |
| 5,438,451 A | 8/1995 | Schweizer |
| 5,439,781 A | 8/1995 | MacDowell et al. |
| 5,485,053 A | 1/1996 | Baz |
| 5,529,277 A | 6/1996 | Ostaszewski |
| 5,537,262 A | 7/1996 | Aoki et al. |
| 5,581,605 A | 12/1996 | Murakami et al. |
| 5,642,237 A | 6/1997 | Miyawaki et al. |
| 5,694,257 A | 12/1997 | Arnone et al. |
| 5,719,846 A | 2/1998 | Matoba et al. |
| 5,724,017 A | 3/1998 | Pla et al. |
| 5,737,137 A | 4/1998 | Cohen et al. |
| 5,784,355 A | 7/1998 | Abe |
| 5,870,133 A | 2/1999 | Naiki |
| 5,891,317 A | 4/1999 | Teichmann et al. |
| 5,896,438 A * | 4/1999 | Miyake et al. ............... 378/34 |
| 5,986,795 A | 11/1999 | Chapman et al. |
| 5,986,827 A | 11/1999 | Hale |
| 6,033,079 A | 3/2000 | Hudyma |
| 6,054,784 A | 4/2000 | Sperling et al. |
| 6,108,121 A | 8/2000 | Mansell et al. |
| 6,118,577 A | 9/2000 | Sweatt et al. |
| 6,144,511 A | 11/2000 | Umetsu et al. |
| 6,160,628 A | 12/2000 | Inoue |
| 6,166,868 A | 12/2000 | Holderer et al. |
| 6,195,201 B1 | 2/2001 | Koch et al. |
| 6,208,407 B1 | 3/2001 | Loopstra |
| 6,210,865 B1 | 4/2001 | Sweatt et al. |
| 6,225,027 B1 | 5/2001 | Replogle et al. |
| 6,229,657 B1 | 5/2001 | Holderer et al. |
| 6,246,822 B1 | 6/2001 | Kim et al. |
| 6,252,334 B1 | 6/2001 | Nye et al. |
| 6,252,648 B1 | 6/2001 | Hase et al. |
| 6,252,712 B1 | 6/2001 | Furter et al. |
| 6,259,571 B1 | 7/2001 | Holderer et al. |
| 6,275,344 B1 | 8/2001 | Holderer |
| 6,290,363 B1 | 9/2001 | Masutani |
| 6,296,811 B1 | 10/2001 | Sasaki |
| 6,307,688 B1 | 10/2001 | Merz et al. |
| 6,337,484 B1 | 1/2002 | Loopstra et al. |
| 6,341,006 B1 | 1/2002 | Murayama et al. |
| 6,369,959 B1 | 4/2002 | Trunz et al. |
| 6,373,552 B1 | 4/2002 | Braat et al. |
| 6,392,825 B1 | 5/2002 | Trunz et al. |
| 6,405,533 B1 | 6/2002 | Rastegar et al. |
| 6,411,368 B1 | 6/2002 | Matsumoto et al. |
| 6,411,426 B1 | 6/2002 | Meehan et al. |
| 6,428,173 B1 | 8/2002 | Dhuler et al. |
| 6,445,515 B2 | 9/2002 | Moennig |
| 6,445,516 B2 | 9/2002 | Osterried |
| 6,449,106 B1 | 9/2002 | Spinali |
| 6,466,380 B2 | 10/2002 | Bischoff |
| 6,469,827 B1 | 10/2002 | Sweatt et al. |
| 6,473,247 B1 | 10/2002 | Keller et al. |
| 6,478,434 B1 | 11/2002 | Streetman et al. |
| 6,496,466 B1 | 12/2002 | Lee et al. |
| 6,501,605 B2 | 12/2002 | Moriya |
| 6,503,383 B1 | 1/2003 | Holderer et al. |
| 6,509,670 B2 | 1/2003 | Jeong et al. |
| 6,521,892 B2 | 2/2003 | Emanuel et al. |
| 6,537,479 B1 | 3/2003 | Colea |
| 6,538,829 B2 | 3/2003 | Rau et al. |
| 6,539,142 B2 | 3/2003 | Lemoff et al. |
| 6,549,692 B1 | 4/2003 | Harel et al. |
| 6,552,862 B2 | 4/2003 | Dieker |
| 6,560,384 B1 | 5/2003 | Helkey et al. |
| 6,566,627 B2 | 5/2003 | Brandinger et al. |
| 6,580,570 B2 | 6/2003 | Becker et al. |
| 6,585,379 B2 | 7/2003 | Yokoyama et al. |
| 6,594,057 B1 | 7/2003 | Drake et al. |
| 6,594,093 B2 | 7/2003 | Moeller et al. |
| 6,603,615 B2 | 8/2003 | Melzer et al. |
| 6,614,504 B2 | 9/2003 | Aoki |
| 6,628,371 B1 | 9/2003 | Ishikawa |
| 6,633,107 B1 | 10/2003 | Calabro et al. |
| 6,646,713 B2 | 11/2003 | Ishii |
| 6,653,887 B2 | 11/2003 | Haeusser-Boehm et al. |
| 6,658,084 B2 | 12/2003 | Singer |
| 6,667,255 B2 | 12/2003 | Hexels |
| 6,667,839 B2 | 12/2003 | Hartmaier et al. |
| 6,717,742 B2 | 4/2004 | Weber |
| 6,727,984 B2 | 4/2004 | Becht |
| 6,729,062 B2 | 5/2004 | Thomas et al. |
| 6,733,369 B1 | 5/2004 | Stacklies et al. |
| 6,768,567 B2 | 7/2004 | Naulleau |
| 6,768,600 B2 | 7/2004 | Dieker |
| 6,791,768 B2 | 9/2004 | Rau |
| 6,798,494 B2 | 9/2004 | Naulleau |
| 6,798,588 B2 | 9/2004 | Vogt |
| 6,816,325 B1 | 11/2004 | Becker et al. |
| 6,825,914 B2 | 11/2004 | Schroeder et al. |
| 6,829,107 B2 | 12/2004 | Osterried |
| 6,844,994 B2 | 1/2005 | Melzer et al. |
| 6,853,440 B1 | 2/2005 | Van De Pasch et al. |
| 6,859,263 B2 | 2/2005 | Naulleau |
| 6,859,515 B2 | 2/2005 | Schultz et al. |
| 6,870,554 B2 | 3/2005 | Jain |
| 6,964,485 B2 | 11/2005 | Singer et al. |
| 7,196,841 B2 * | 3/2007 | Melzer et al. ............... 359/351 |
| 2002/0021903 A1 | 2/2002 | Ito et al. |
| 2002/0163741 A1 | 11/2002 | Shibazaki |
| 2002/0167740 A1 | 11/2002 | Osterried et al. |
| 2002/0176094 A1 | 11/2002 | Petasch et al. |
| 2003/0043359 A1 * | 3/2003 | Naulleau ............... 355/71 |
| 2004/0119961 A1 | 6/2004 | Singer et al. |
| 2004/0232354 A1 * | 11/2004 | Singer et al. ............... 250/492.2 |
| 2005/0087699 A1 * | 4/2005 | Miyake ............... 250/492.1 |
| 2005/0146702 A1 * | 7/2005 | Eurlings et al. ............... 355/67 |
| 2005/0174650 A1 * | 8/2005 | Melzer et al. ............... 359/627 |
| 2005/0179884 A1 * | 8/2005 | Gui et al. ............... 355/67 |

(56) References Cited

U.S. PATENT DOCUMENTS

| | | | |
|---|---|---|---|
| 2005/0274897 A1* | 12/2005 | Singer et al. | 250/372 |
| 2006/0001854 A1 | 1/2006 | Singer et al. | |
| 2006/0138364 A1* | 6/2006 | Miyake | 250/504 R |
| 2006/0245540 A1* | 11/2006 | Schultz et al. | 378/34 |
| 2007/0139757 A1* | 6/2007 | Lock | 359/290 |
| 2007/0152171 A1* | 7/2007 | Goldstein et al. | 250/492.3 |
| 2007/0206172 A1* | 9/2007 | Gui et al. | 355/69 |
| 2007/0231715 A1* | 10/2007 | Han et al. | 430/5 |
| 2008/0225387 A1* | 9/2008 | Hainz et al. | 359/351 |
| 2009/0213356 A1* | 8/2009 | Gruner et al. | 355/71 |
| 2010/0149669 A1* | 6/2010 | Smith | 359/850 |
| 2010/0231877 A1* | 9/2010 | Wolschrijn et al. | 355/66 |
| 2011/0063596 A1* | 3/2011 | Mann et al. | 355/67 |
| 2011/0177463 A1* | 7/2011 | Layh et al. | 430/325 |
| 2012/0293785 A1* | 11/2012 | Kirch et al. | 355/71 |

FOREIGN PATENT DOCUMENTS

| | | | |
|---|---|---|---|
| DE | 199 36 568 | | 2/2001 |
| DE | 100 53 587 | | 5/2002 |
| DE | 101 20 446 | | 11/2002 |
| DE | 10 2006 039 655 | | 3/2008 |
| DE | 102006039655 | A1 * | 3/2008 |
| EP | 0 939 341 | A2 | 2/1999 |
| EP | 1 026 547 | | 1/2000 |
| EP | 1 262 836 | | 12/2002 |
| EP | 1 566 697 | | 8/2005 |
| JP | 9-298140 | A | 11/1997 |
| JP | 2005-136422 | | 5/2005 |
| JP | 2005-524236 | | 8/2005 |
| JP | 2005-236291 | | 9/2005 |
| JP | 2006-128321 | | 5/2006 |
| JP | 2010-502003 | | 1/2010 |
| WO | WO 86/05281 | | 9/1986 |
| WO | WO 99/66542 | | 12/1999 |
| WO | WO 2008/022680 | | 2/2008 |

OTHER PUBLICATIONS

Gruener et al., "Design considerations for table-top, laser-based VUV and X-ray free electron lasers", Dec. 13, 2006.

Goldstein et al., "Compact FEL Application for EUV Lithography", EUV Source Workshop, Oct. 19, 2006.

Pagani et al., Design considerations of 10 kW-scale extreme ultraviolet SASE FEL for lithography, Nuclear Instruments and Methods in Physics Research A 463 (2001) 9-25.

Hajima et al., A Multi-kw EUV light source Driven by Energy-Recovery Linac, EUV Source Workshop, Barcelona, Spain, Oct. 19, 2006.

Saldin et al., Free electron laser as a potential source for EUV lithography, EUV Source Workshop, Barcelona, Spain, Oct. 19, 2006.

Burns et al, "Compat, Multichannel receiver using InGaAs APDs for single pulse, eye,-safe, laser radar imagery," SPIE, 3065:22-29, 1997.

Ellis, "Low-cost Bimorph Mirrors in Adaptice Optics," Imperial College of science, Technology & Medicine, University of London, 1990.

Krug et al., Application of a 6.8 Silicon APD Array and Hybrid Electronics for Scannerless 3D Imaging Ladar, NATO/IRIS Active Systems, vol. II:79-89, 1995.

Ro et al., "Vibration Control if Plates Using Self-Sensing Active Constrained Layer Damping," SPIE 3672:200-209, 1999.

Sato et al., Adaptive PVDF piezoelectric deformable mirror system, Applied Optics, 19(9): 1430-1434, 1980.

Sato et al., "Multilayered deformable mirror using PVDF films," Applied Optics, 21(20):3664-3668, 1982.

Sato et al., "Transmission-type PVDF 2-D optical phase modulator," Applied Optics, 20(2):343-350, 1981.

Schulz et al., "Calibration of an interferometer for testing cylindrical surfaces," Elsevier Science, 512-520, 1995.

Japanese examination report, with English translation, for corresponding JP Appl No. 2011-502244, dated Nov. 29, 2012.

* cited by examiner

PROJECTION ILLUMINATION SYSTEM FOR EUV MICROLITHOGRAPHY

CROSS-REFERENCE TO RELATED APPLICATIONS

This application is a continuation of, and claims benefit under 35 USC §120 to, international application PCT/EP2008/067594, filed on Dec. 16, 2008, which claims benefit of German Application No. 10 2008 000 967.9, filed Apr. 3, 2008. International application PCT/EP2008/067594 is hereby incorporated by reference in its entirety.

FIELD

The disclosure relates to a projection illumination installation for EUV microlithography.

BACKGROUND

A projection illumination installation is known from U.S. Pat. No. 6,859,515 B2 and U.S. Pat. No. 5,439,781. A projection illumination installation for EUV microlithography is known from US 2007/0152171 A1.

SUMMARY

The disclosure provides a projection illumination installation configured so that the output power of an EUV light source can be used for EUV projection illumination in a highly efficient fashion.

In some embodiments, a projection illumination installation for EUV microlithography includes an EUV light source to produce EUV light. The installation also includes illumination optics to illuminate an object field with the EUV light, and projection optics to map the object field into an image field. The installation also includes a scanning device to illuminate the object field by deflecting the EUV light in sync with a projection illumination period.

It has been recognized that a scanning device for illuminating the field facet mirror in sync with the projection illumination provides an opportunity to use the illumination optics of the projection illumination installation without having to widen an often small divergence angle for the EUV light source, which is usually associated with losses. A numerical aperture for the illumination optics is filled using the scanning device not all at once but rather sequentially, for example via row-by-row scanning. It has been recognized that many EUV light sources usually have a repetition rate which is so high that such sequential scan illumination of the illumination optics does not result in restrictions for the mapping quality. A projection illumination period has elapsed when the entire object field has been illuminated with a prescribed illumination intensity.

In some embodiments, facet mirrors are particularly suitable for providing a defined object field illumination. The facet mirror can be illuminated by the scanning device. Alternatively, the facet mirror may also be part of the scanning device itself.

A synchrotron radiation based EUV light source, and particularly a free electron laser (FEL), can provide particularly high beam brilliance. As an alternative to an FEL, it is also possible to use a wiggler or an undulator. The synchrotron radiation based EUV light sources usually have a small divergence angle which can advantageously be widened by the scanning device. Synchrotron radiation based EUV light sources usually have a very high repetition rate, which allows advantageous combination with the scanning device according to the disclosure.

By way of example, scanning devices are known in connection with the development of laser RGB displays or laser television sets and have proven themselves for beam deflection even when the highest deflection frequencies are involved. Examples of scanning devices include: at least one activation tiltable mirror that includes a single mirror face; at least one polygonal mirror; and at least one mirror configured to move translationally back and forth, where the at least one mirror has at least two reflection faces configured to tilt relative to one another.

An intensity modulator can be used to produce a specific intensity variation during the scanning operation. This can be used particularly for correction purposes.

An intensity modulator can be used for specifically influencing or correcting an intensity distribution for the EUV light on the object field. If all the field facets of the field facet mirror have the EUV the light applied with the same intensity distribution, this results in a corresponding intensity distribution over the object field.

An intensity modulator can be used for specifically influencing or correcting an illumination angle distribution over the object field. In this case, the synchronization may be such that the pupil facets always have the same intensity distribution applied for the synchronized sweep over the pupil facet mirror. This makes it possible to obtain a prescribed illumination angle distribution which is constant over time. Alternatively, the intensity distribution over the pupil facet mirror can be altered for successive scans. This allows the illumination angle distribution to be varied over time.

A scanning device may have a similar action to an intensity modulator. Such a scanning device makes it possible to obtain loss-free intensity modulation of the facets of the field facet mirror and/or of the pupil facet mirror, in particular. Regions which are swept over at a relatively fast deflection speed are subject to a lower application of intensity in this case than regions which are swept over at a relatively low deflection speed.

In some embodiments, efficient utilization of the entire average power of an EUV synchrotron light source can be achieved.

A field facet mirror can be actuated with little complexity via the scanning device. The row and column arrangement does not necessarily require the individual field facets to be rectangular. Another edging shape for the field facets is also possible, for example arcuate edging, particularly part-ring shaped edging.

A field shaping mirror, which may be in the form of a single facet, can dispense with a multifaceted design.

BRIEF DESCRIPTION OF THE DRAWINGS

Exemplary embodiments of the disclosure are explained in more detail below with reference to the drawing, in which.

DETAILED DESCRIPTION

Figure 1:
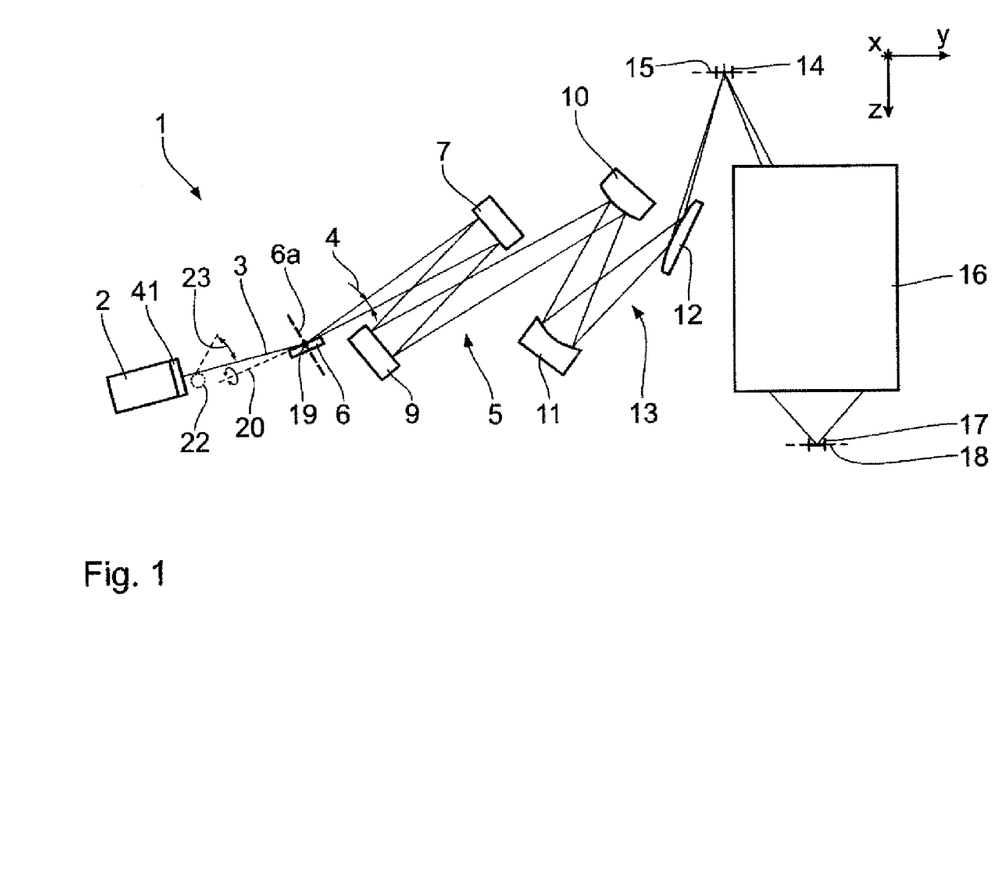
FIG. 1 shows, schematically in relation to illumination optics, a meridional section through a projection illumination installation for microlithography.

A projection illumination installation 1 for microlithography is used to produce a microstructured or nanostructured electronic semiconductor component. A light source 2 emits EUV radiation in the wavelength range between 5 nm and 30 nm, for example. The light source 2 is in the form of a free electron laser (FEL). This is a synchrotron radiation source, which produces coherent radiation at very high brilliance. Such FELs are known to a person skilled in the art from Pagani et al., Nucl. Instr. & Methods A463 (2001), pp 9 and from Ackermann et al., Nature photonics Vol. 1 (2007), 336 pp. Customization of large FEL installations of this kind to the desired properties of EUV lithography has been presented to a person skilled in the art at the EUVL Source Workshop for the EUVL Symposium of the international organization Sematech in October 2006 (cf. "extreme ultraviolet lithography" (EUVL) Symposium. International. 5 CH 2006. (4 VOLS), published by Curran Associates, INC. in April 2007), particularly in the professional articles by Saldin et al., Hajima et al. and Goldstein. The proceedings of this EUVL source workshop are published at the Internet address http://www.sematech.org/meetings/archives/litho/euv/7855/. A compact FEL, which is suitable as light source 2, is described in US 2007/0152171 A1. Further considerations regarding the design of an FEL as a light source 2 can be found by a person skilled in the art in the professional article "Design considerations for table-top, laser-based VUV and X-ray free electron lasers" by F. Grüner et al., which is published at the Internet address http://arxiv.org/PS_cache/physics/pdf/0612/0612125v1.pdf. The full scope of the content of the aforementioned prior art will be part of this application.

The light source 2 has an average power of 2.5 kW. The pulse frequency of the light source 2 is 30 MHz. Every single radiation pulse then carries energy of 83 µJ. With a radiation pulse length of 100 fs, this corresponds to a radiation pulse power of 833 MW.

For the illumination and mapping within the projection illumination installation 1, a used radiation bundle 3 is used. The used radiation bundle 3 is illuminated within an aperture angle 4, which matches illumination optics 5 of the projection illumination installation 1, using a scanning device 6 which is yet to be described. Starting from the light source 2, the used radiation bundle 3 has a divergence which is less than 5 mrad. The scanning device 6 is arranged in an intermediate focal plane 6a of the illumination optics 5. After the scanning device 6, the used radiation bundle 3 first of all impinges upon a field facet mirror 7. Details regarding the scanning device 6 will be explained below with reference to FIG. 2.

The used radiation bundle 3 has, in particular, a divergence which is less than 2 mrad, such as less than 1 mrad. The spot size of the used radiation bundle on the field facet mirror 7 is approximately 4 mm.

Figure 3:
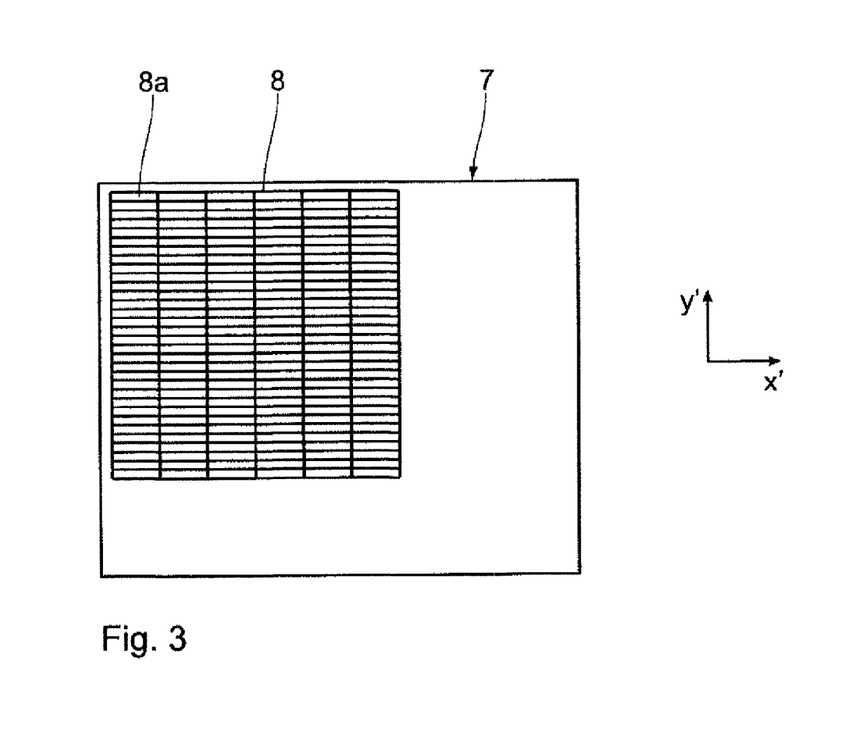
FIG. 3 schematically shows a design for a field facet array of a field facet mirror in the illumination optics.

FIG. 3 shows an example of a facet arrangement, a field facet array, for field facets 8 of the field facet mirror 7. Only some of the field facets 8 that are actually present are shown. The field facet array of the field facet mirror 7 has 6 columns and 75 rows. The field facets 8 have a rectangular shape. Other shapes for the field facets 8 are also possible, for example an arcuate shape or an annular or partially annular geometry. Overall, the field facet mirror 7 has 450 field facets 8. Each field facet 8 has an extent of 50 mm in the direction which is horizontal in FIG. 3 and 4 mm in the direction which is vertical in FIG. 3. The entire field facet array accordingly has an extent of 300 mm×300 mm. The field facets 8 are not shown to scale in FIG. 3.

Following reflection at the field facet mirror 7, the used radiation bundle 3, which is split into pencil beams which are associated with the individual field facets 8, impinges on a pupil facet mirror 9. Pupil facets of the pupil facet mirror 9—which are not shown in FIG. 1—are round. Each pencil beam of the used radiation bundle 3 that is reflected by one of the field facets 8 has an associated one of these pupil facets, so that a respective struck facet pair prescribes, with one of the field facets 8 and one of the pupil facets, a beam guidance channel for the associated pencil beam of the used radiation bundle 3. The channel-by-channel association of the pupil facets with the field facets 8 is made on the basis of desired illumination by the projection illumination installation 1. For the purpose of actuating respective prescribed pupil facets, the field facet mirrors 8 are each individually tilted.

The pupil facet mirror 9 and downstream transmission optics 13, including three EUV mirrors 10, 11, 12, are used to map the field facets 8 into an object field 14 in an object plane 15 of projection optics 16 in the projection illumination installation 1. The EUV mirror 12 is in the form of a grazing incidence mirror.

In an embodiment of the illumination optics 5 which is not shown, particularly when an entry pupil of the projection optics 16 is in a suitable position, it is also possible to dispense with the mirrors 10, 11 and 12, which results in a corresponding transmission increase in the projection illumination installation for the used radiation bundle 3.

The long side of the field facets 8 is at right angles to the scanning direction y. The aspect ratio of the field facets 8 corresponds to that of the slot-shaped object field 14, which may likewise be in rectangular or arcuate form.

The whole object field 14 experiences a total dose of 24.6 J per complete scan of the field facet mirror 7. This total dose is multiplied by the total transmission of the illumination optics 5, on the one hand, and of the projection optics 16, on the other hand.

The object plane 15 in the region of the object field 14 contains a reticle—not shown in FIG. 1—which reflects the used radiation bundle 3.

The projection optics 16 map the object field 14 into an image field 17 in an image plane 18. For the projection illumination, this image plane 18 contains a wafer—not shown—which carries a light-sensitive layer which is illuminated during the projection illumination with the projection illumination installation 1.

To facilitate the illustration of positional relationships, an xyz coordinate system is subsequently used. The x-axis is perpendicular to the plane of the drawing in FIG. 1 and points into it. The y-axis runs to the right in FIG. 1. The z-axis runs downward in FIG. 1.

During the projection illumination, both the reticle and the wafer are scanned in sync in the y-direction in FIG. 1. The wafer is scanned at a scanning speed of typically 200 mm/s in the y-direction during the projection illumination.

Figure 2:
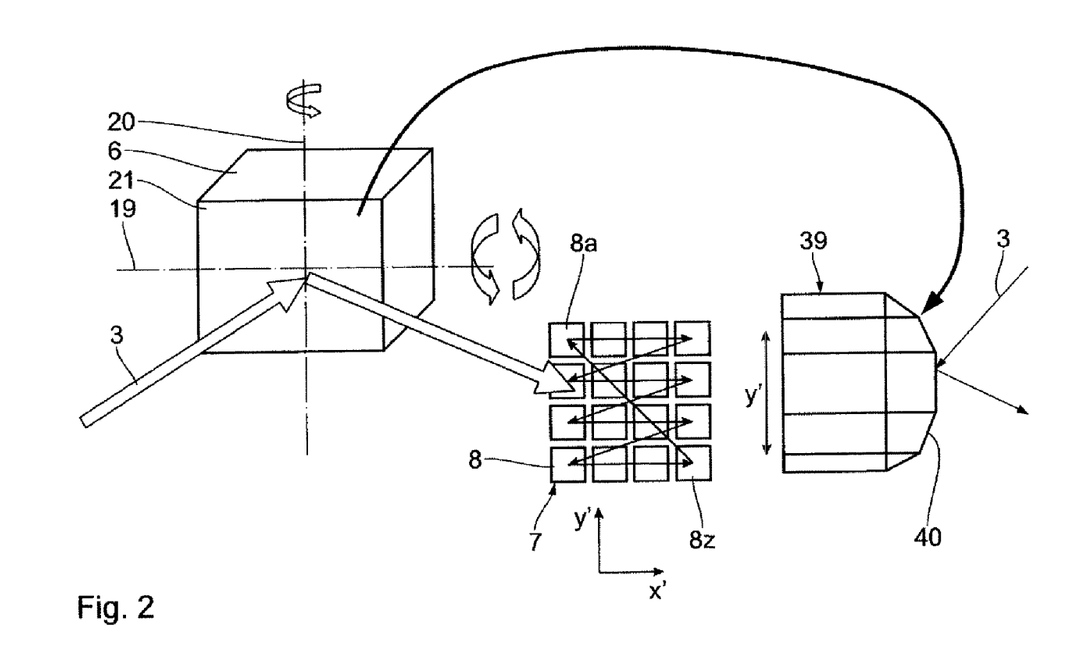
FIG. 2 shows a highly schematic illustration of components of a scanning device arranged upstream of the illumination optics in the projection illumination installation.

FIG. 2 shows the scanning device 6 for the used radiation bundle 3 in greater detail. An x'-y' coordinate system is used in FIG. 2 to facilitate the illustration of positional relationships. The x'-axis, which is parallel to the x-axis, runs to the right in FIG. 2. The y'-axis, which lies in the yz-plane, runs upward in FIG. 2.

The scanning device 6 is a scanning mirror which reflects the used radiation bundle 3 in a sweeping manner and which can be tilted about a row advance axis 19, which is parallel to the x'-axis, and about a column scan axis 20, which is at right angles to the row advance axis. Both axes 19, 20 are situated in a reflective mirror face 21 of the scanning device 6. The row advance axis 19 is parallel to the x'-axis in FIG. 2. The column scan axis 20 is parallel to the y'-axis in FIG. 2.

FIG. 2 shows the field facet mirror 7 schematically as a 4×4 array with four horizontal rows of four field facets 8 each. The subsequent frequency and time data relate to the illumination of the field facet mirror 7 with the 6×75 array, already described in connection with FIG. 3. The tilting about the column scan axis 20 is effected at the row frequency of 7.5 kHz. In this case, the mirror face 21 is tilted about +/−4.5°, which results in a deflection angle for the used radiation bundle 3 of +/−9°. Accordingly, the dwell time for the used radiation bundle 3 on a respective row of the field facet mirror 7 is 133.3 µs. The row advance is effected via synchronized tilting about the row advance axis 19, so that the 75 rows are scanned using the correct row interval, with the tilting about the row advance axis 19 also ensuring that the used radiation bundle 3 returns from the last scanned field facet 8z to the first field facet 8a which is to be scanned. The mirror face 21 is therefore additionally tilted about the row advance axis 19 at a frequency of 100 Hz. The dwell time per individual field facet 8 is 22.2 µs. During the dwell time on a field facet 8, 660 EUV radiation pulses thus impinge on the field facet 8.

The interval between the mirror face 21 and the field facet mirror 7 is approximately 1 m.

Instead of tilting about the column scan axis 20, the row advance can also be produced using a polygon scanner—not shown—which rotates about the column scan axis 20. This polygon scanner has a total of 40 polygon facets for the mirror tilt variation about +/−4.5°, that is to say is designed as a regular 40-gon about its axis of rotation in the circumferential direction. A row frequency of 7.5 kHz is achieved with a rotation frequency for the polygon scanner of 187.5 Hz. When the scanning device 6 is designed with the polygonal mirror—not shown—the latter has a tilt mirror arranged upstream or downstream of it which, as described above, can be tilted about the row advance axis 19.

The object field 14 has a slot width parallel to the scanning direction y of 2 mm and a slot width at right angles to the scanning direction, that is to say in the x-direction, of 26 mm. At a dose of 24.6 J on the reticle and transmission of the projection optics 16 of 0.3%, a dose of 74 mJ on the wafer is obtained per complete scan of the field facet mirror 7. The face-related dose on the object field 14 is 150 mJ/cm². For an assumed sensitivity of the light-sensitive layer of the wafer of 10-20 mJ/cm², the light source 2 typically provides a factor of 7.5 to a factor of 15 more light than is used for illuminating a light-sensitive layer of this kind. In principle, it is thus possible to use one and the same light source 2 to illuminate a plurality of object fields 14 simultaneously.

In a first variant of such simultaneous illumination of a plurality of object fields 14, the used radiation bundle 3 is fanned out by a polygonal mirror 22—shown in dashes in FIG. 1—in the yz-plane through a fan angle 23 of 45° immediately after leaving the light source 2. The used radiation bundle 3 fanned out in this manner is then distributed over a total of 10 illumination optics 5, which each accept ¹⁄₁₀ of the whole fan angle. Each of the ten beam paths for the used radiation bundle 3 then contains a scanning device 6 in the manner of that which has already been explained above.

If the light source 2 has a repetition rate of 30 MHz, fanning out the used radiation bundle 3 in order to use a total of ten illumination optics 5 through a fan angle 23 of 45° involves a polygonal mirror 22 with a total of 16 evenly distributed polygon facets which rotates at a rotation frequency of 87.5 kHz.

If a plurality of illumination optics 5 are intended to be used, the demands on the polygon scanner 22 can be reduced by reducing the total number of field facets 8 to 100 field facets, for example.

Figure 4:
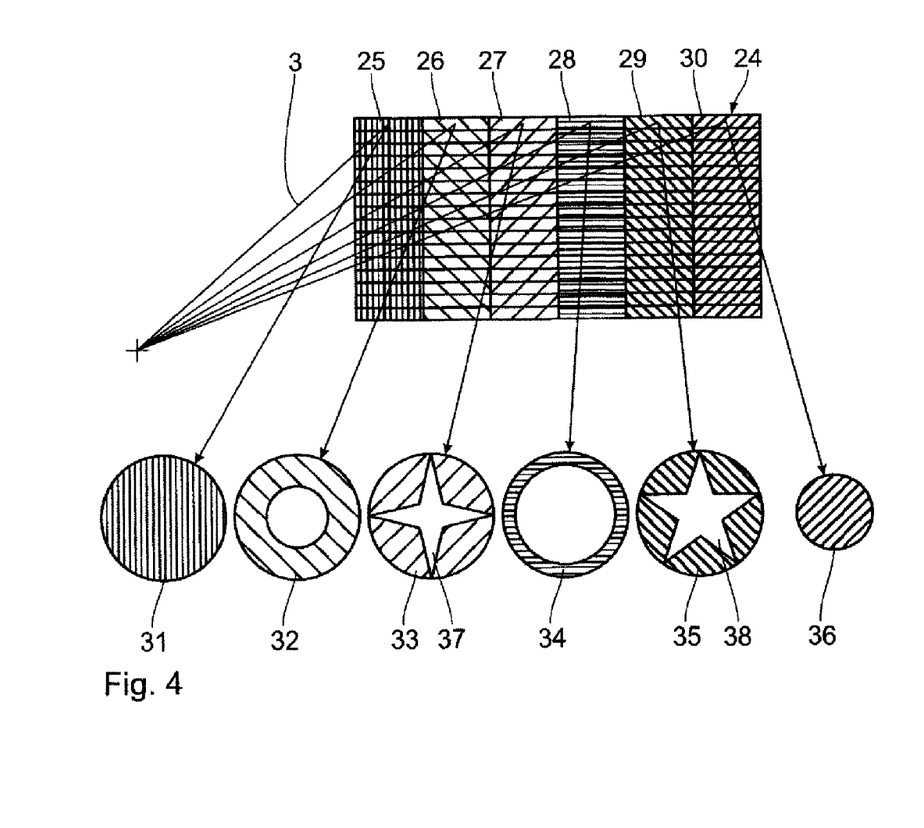
FIG. 4 schematically shows illumination of a plurality of pupil facet arrays of pupil facet mirrors in the illumination optics with one and the same field facet mirror.

A further variant of the design of the projection illumination installation 1 for illuminating a plurality of object fields 14 involves the use of one and the same field facet mirror 24, an embodiment of which is shown in FIG. 4. The field facet mirror 24 has facet mirror sections 25, 26, 27, 28, 29, 30, the facet arrangement of which respectively corresponds to that of the field facet mirror 7. The field facet mirror 24 thus has a total of 24 columns of 75 rows of individual field facets 8 each. For each facet mirror section 25 to 30, there may also be fewer than 450 field facets 8 provided.

Each of the facet mirror sections 25 to 30 illuminates an associated pupil facet mirror 31 to 36. This is achieved by appropriately tilting the field facets of the respective facet mirror sections 25 to 30.

The pupil facet mirror 31, which is associated with the facet mirror section 25, is illuminated completely in a round region. This is what is known as a conventional illumination setting, in which a pupil of the illumination optics 5 is filled uniformly.

The pupil facet mirror 32, which is associated with the facet mirror section 26, is illuminated annularly, that is to say in a ring-shaped manner.

The pupil facet mirror 33, which is associated with the facet mirror section 27, is illuminated like the pupil facet mirror 31, with the difference that there is a central cutout of a star 37 with four points. In line with this star shape, the object field 14 which is illuminated by the pupil facet mirror 33 lacks illumination directions.

The pupil facet mirror 34, which is associated with the facet mirror section 28, is illuminated annularly, that is to say in a ring-shaped manner, in comparable fashion to the pupil facet mirror 32, the ring width for the illumination of the pupil facet mirror 34 being approximately half the magnitude of the ring width for the illumination of the pupil facet mirror 32, given the same ring diameter.

The pupil facet mirror 35, which is associated with the facet mirror section 29, is illuminated in a manner comparable to the pupil facet mirror 33, the pupil facet mirror 35 having a central cutout of a star-shaped region 38 with a total of five points, that is to say that the region is not illuminated.

The pupil facet mirror 36, which is associated with the facet mirror section 30, is illuminated in a manner comparable to the pupil facet mirror 31, but with a reduced illumination diameter, so that the maximum illumination angles which are achieved with the illumination optics 5 with the pupil facet mirror 36 are reduced in comparison with the maximum illumination angle of the other illumination optics 5 with the pupil facet mirrors 31 to 35.

Besides the embodiments which have been explained above in connection with the pupil facet mirrors 31 to 36, other embodiments are also possible, for example dipole, quadrupole or other shapes of multipole embodiments.

A row advance, that is to say a change between the different rows of the field facet mirror 7, can alternatively also be achieved via reflection at a facet mirror 39 displaced parallel to the columns of the field facet mirror 7—shown at the bottom right in FIG. 2.

The displacement direction of the facet mirror 39 is parallel to the y-direction. Depending on the point of appearance of the used radiation bundle 3 on one of the facets 40 of the facet mirror 39, the used radiation bundle 3 is deflected into another row of the field facet mirror 7. FIG. 2 shows a facet mirror 39 with five facets 40. This illustration is simplistic. Illuminating the facet mirror 7 shown in FIG. 3 involves a facet mirror 39 with 75 facets. This faceting using 75 facets can then also be combined with a faceting in the circumferential direction around the column scan axis 20, so that the facet mirror 39 is provided with the shape of a faceted convex body, particularly a faceted sphere. Instead of the faceting, sufficiently small used radiation bundles 3 allow the facet mirror 39 also to be produced with a continuous contour, the facet faces having continuous transitions and no sharp edges between them. The planar sections between these soft transitions have the same normal vectors as in the embodiment with the sharp edges.

In a further variant of the projection illumination installation 1, the light source 2 is equipped with an intensity modulator 41 for modulating the intensity of the used radiation bundle 3. The intensity modulator 41 has a signaling connection to the scanning device 6 and possibly to the actuation of the polygonal mirror 22 for the purpose of synchronization. The intensity modulator 41 can be operated such that the intensity of the used radiation bundle 3 is influenced while a single field facet 8 of a field facet mirror, for example the field facet mirror 7, is being swept over. If this influencing is effected in the same way in the case of all the field facets 8 of the field facet mirror 7 which are swept over, the result is corresponding influencing for the intensity distribution of the illumination in the object field 14.

As an alternative or in addition, the intensity modulation via the intensity modulator 41 can be effected in sync with the scanning device 6 and possibly with the polygonal mirror such that the intensity of the used radiation bundle 3 is influenced in sync with the sweeping-over of a pupil facet mirror. This makes it possible to achieve correction of the illumination angle distribution over the object field 14.

An effect which corresponds to the intensity modulation with the intensity modulator 41 can also be achieved by varying the deflection speed of the deflection of the used radiation bundle 3 when sweeping over the field facet mirror 7. If, by way of example, the field facet mirror 7 is scanned at varying deflection speeds such that the center of each field facet 8 is swept over more quickly than the two edges at the right-hand and left-hand edges of the field facet 8, the result is that the used radiation bundle 3 is applied to the object field 14 and is applied less intensely to the center in comparison with the edge.

By way of example, intensity modulation of the light source 2 is possible by shutting off radiation pulses, by disturbing the laser function, for example by specifically detuning the resonator, and/or by modulating the laser frequency.

Radiation pulses can be shut off by actuating a Q-switch or by electro-optical or acousto-optical modulators or deflectors (EOM, AOM) arranged inside the resonator or outside the resonator. The laser function can be disturbed by additionally connected electromagnetic fields, for example. A wavelength for the EUV used radiation can be detuned by subsequent scatter on a relativistic electron beam via the inverse Compton effect, for example. For this detuning, it is possible to use a portion of the electrons to be recycled from an FEL. The detuning of the wavelength of the EUV used radiation is greater than a bandwidth for EUV reflection coatings on the mirror elements of the illumination optics 5. Such a reflection coating may be in the form of a multilayer coating.

Pulsed actuation of the light source 2 allows specific prescribing firstly of an intensity distribution and secondly of an illumination angle distribution over the object field 14.

Each field point in the object field 14 has appropriately conjugated points on the individual field facets 8 associated with it. Insofar as the radiation pulses of the used radiation bundle 3 are suppressed whenever they are otherwise applied to these facet points, which are associated with a particular field point, it is possible to influence the illumination intensity at the relevant field point. If N field facets 8 are being used for the overlaying illumination of the object field 14, a correction with a relative accuracy of 1/N can be achieved by suppressing the illumination at a facet point of one of the field facets 8.

For a given point on the object field 14, each illumination channel, which is associated with one of the field facets 8 via the pupil facet mirror 9, corresponds to a particular illumination angle. Accordingly, intensity modulation of the radiation pulses of the used radiation bundle 3 such that entire illumination channels of this kind are suppressed allows the illumination angle distribution over the object field 14 to be influenced.

In principle, instead of a field facet mirror which has a plurality of field facets, it is also possible for the field facet mirror to be provided as part of the scanning device itself. In that case, the field facet mirror has precisely one facet which is activation tiltable through two degrees of freedom and, as a result, also directly illuminates the pupil facets of the pupil facet mirror or the object field, for example.

What is claimed is:

1. An installation having an object field and an image field, the installation comprising:
   a light source configured to generate EUV light with a pulse frequency;
   illumination optics configured to illuminate the object field with the EUV light, the illumination optics comprising a field facet mirror comprising a plurality of field facets including a first field facet and a second field facet;
   projection optics configured to map the object field into the image field; and
   a scanning device configured to deflect the EUV light onto the field facet mirror so that, during use of the installation:
   a first pulse of EUV light illuminates the first field facet without illuminating the second field facet; and
   a second pulse of EUV light illuminates the second field facet without illuminating the first facet,
   wherein:
   the installation is an EUV microlithography projection illumination installation;
   the scanning device has a first axis and a second axis perpendicular to the first axis; and
   during use of the illumination optics:
   light deflected by the scanning device impinges the field facet mirror;
   rotation of the scanning device about its first axis advances EUV light deflected by the scanning device along the field facet mirror in a first direction; and
   rotation of the scanning device about its second axis advances the EUV light deflected by the scanning device along the field facet mirror in a second direction which is different from the first direction.

2. The installation as claimed in claim 1, wherein the illumination optics comprise at least one pupil facet mirror comprising a plurality of pupil facets configured to prescribe an illumination angle distribution for the object field.

3. The installation as claimed in claim 1, wherein the EUV light source is a synchrotron radiation based light source.

4. The installation as claimed in claim 1, wherein the scanning device comprises at least one activation tiltable mirror comprising a single mirror face.

5. The installation as claimed in claim 1, wherein the scanning device comprises at least one polygonal mirror.

6. The installation as claimed in claim 1, wherein the scanning device comprises at least one mirror configured to move translationally back and forth, the at least one mirror comprising at least two reflection faces configured to tilt relative to one another.

7. The installation as claimed in claim 1, further comprising an intensity modulator configured to modulate an intensity of the EUV light.

8. The installation as claimed in claim 7, wherein the intensity modulator is configured to influence the intensity of the EUV light in sync with the deflection of the EUV light caused by the scanning device.

9. The installation as claimed in claim 7, wherein the intensity modulator is configured to be actuated so that the intensity of the EUV light is influenced during the sweep over a single field facet of the illumination optics.

10. The installation as claimed in claim 7, wherein the intensity modulator is configured to be actuated so that the intensity of the EUV light is influenced in sync with a sweep over a pupil facet mirror of the illumination optics.

11. The installation as claimed in claim 1, wherein the scanning device is configured to be actuated so that a deflection speed of the deflection of the EUV light caused by the scanning device is varied in a synchronized fashion.

12. The installation as claimed in claim 1, wherein the installation is configured so that, during use of the installation, a plurality of object fields of the illumination optics are illuminated via the scanning device.

13. The installation as claimed in claim 12, wherein the illumination optics comprise a plurality of pupil facet mirrors, each pupil facet mirror having a respective object field, projection optics and image field.

14. The installation as claimed in claim 13, wherein each pupil facet mirror is illuminated by the field facet mirror.

15. The installation as claimed in claim 1, wherein the installation is configured so that, during use, a plurality of the field facets are illuminated alternately by the scanning device.

16. The installation as claimed in claim 1, wherein the plurality of field facets comprises a row-oriented and column-oriented array of field facets.

17. The installation as claimed in claim 1, wherein the scanning device comprises a field-shaping mirror that is tiltable through two degrees of freedom.

18. The installation as claimed in claim 1, wherein the scanning device is arranged in an intermediate focal plane of the illumination optics.

19. The installation as claimed in claim 1, wherein the EUV light source has a pulse frequency of 30 MHz.

20. The installation as claimed in claim 1, wherein the light source is a free electron laser.

21. The installation as claimed in claim 1, wherein the illumination optics comprise a pupil facet mirror comprising a plurality of pupil facets arranged along rows and columns, and wherein during use of the illumination optics the EUV light is deflected by the field facet mirror and sequentially impinges facets of the pupil facet mirror on a facet-by-facet basis.

22. A method, comprising:
using a light source to generate a plurality of pulses of EUV light including a first pulse of EUV light and a second pulse of EUV light;
illuminating a first field facet of a field facet mirror with the first pulse of EUV light without illuminating a second field facet of the field facet mirror with the first pulse of EUV light, the field facet mirror being a component of an illumination optics of a microlithography projection illumination installation;
illuminating the second field facet with the second pulse of EUV light without illuminating the first field facet with the second pulse of EUV light; and
projecting the EUV light from an object plane of the microlithography projection illumination installation to an image plane of the microlithography projection illumination installation,
wherein the method comprises:
rotating a scanning device about first a first axis; and
rotating the scanning device about a second axis which is different from the first axis; and
wherein rotating the scanning device about its first axis advances the EUV light deflected by the scanning device along the field facet mirror in a first direction, and rotating the scanning device about its second axis advances the EUV light deflected by the scanning device along the field facet mirror in a second direction which is different from the first direction.

23. The method as claimed in claim 22, wherein the EUV light deflected by the field facet mirror sequentially impinges facets of a pupil facet mirror of the illumination optics on a facet-by-facet basis.

24. The installation of claim 1, wherein the first direction is perpendicular to the second direction.

25. The installation of claim 1, wherein:
the plurality of facets of the field facet mirror are arranged along rows and columns;
rotation of the scanning device about its first axis advances EUV light deflected by the scanning device along a row of facets of the field facet mirror; and
rotation of the scanning device about its second axis advances the EUV light deflected by the scanning device along a column of the field facet mirror.

26. The method of claim 22, wherein the microlithography projection illumination installation comprises illumination optics, and the method sequentially fills in a numerical aperture of the illumination optics based on a pulse frequency of the light source.

27. The method of claim 22, wherein the first direction is perpendicular to the second direction.

28. The method of claim 22, wherein rotating the scanning device about its first axis advances the EUV light deflected by the scanning device along a row of field facets of the field facet mirror, and rotating the scanning device about its second axis advances the EUV light deflected by the scanning device along a column of field facets of the field facet mirror.

* * * * *

UNITED STATES PATENT AND TRADEMARK OFFICE
CERTIFICATE OF CORRECTION

PATENT NO. : 8,710,471 B2
APPLICATION NO. : 12/887139
DATED : April 29, 2014
INVENTOR(S) : Udo Dinger and Markus Hauf Page 1 of 1

It is certified that error appears in the above-identified patent and that said Letters Patent is hereby corrected as shown below:

On the Title Page

Page 3, Col. 2 (Other Publications), line 13, delete "Compat," and insert -- Compact, --.

Page 3, Col. 2 (Other Publications), line 15, delete "Adaptice" and insert -- Adaptive --.

In the Claims

In Col. 10, line 19, in Claim 22, after "about" delete "first".

Signed and Sealed this
Twenty-second Day of July, 2014

Michelle K. Lee
*Deputy Director of the United States Patent and Trademark Office*